(12) United States Patent
Hosomi

(10) Patent No.: US 11,348,849 B2
(45) Date of Patent: May 31, 2022

(54) SEMICONDUCTOR APPARATUS AND METHOD FOR MANUFACTURING SAME

(71) Applicant: Mitsubishi Electric Corporation, Tokyo (JP)

(72) Inventor: Takeshi Hosomi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/634,526

(22) PCT Filed: Nov. 14, 2017

(86) PCT No.: PCT/JP2017/040936
§ 371 (c)(1),
(2) Date: Jan. 27, 2020

(87) PCT Pub. No.: WO2019/097573
PCT Pub. Date: May 23, 2019

(65) Prior Publication Data
US 2020/0176340 A1    Jun. 4, 2020

(51) Int. Cl.
*H01L 23/04* (2006.01)
*H01L 21/52* (2006.01)
(Continued)

(52) U.S. Cl.
CPC .......... *H01L 23/041* (2013.01); *H01L 21/52* (2013.01); *H01L 21/56* (2013.01); *H01L 23/06* (2013.01);
(Continued)

(58) Field of Classification Search
None
See application file for complete search history.

(56) References Cited

U.S. PATENT DOCUMENTS 7,652,385 B2 * 1/2010 Kuramoto ........... H01L 23/3135
257/790
8,309,858 B2 * 11/2012 Kojima ................. B81B 7/0038
174/260
(Continued)

FOREIGN PATENT DOCUMENTS

JP     H05-335343 A     12/1993
JP     H11-217440 A      8/1999
(Continued)

OTHER PUBLICATIONS

International Search Report issued in PCT/JP2017/040936; dated Dec. 26, 2017.

*Primary Examiner* — Bo B Jang
(74) *Attorney, Agent, or Firm* — Studebaker & Brackett PC

(57) ABSTRACT

In a semiconductor apparatus, the apparatus is so arranged as to comprise: a semiconductor device having electrodes and wiring-interconnects on a main surface of a semiconductor chip; a first resin structure member, being placed on a side of the main surface of the semiconductor chip, constituting, in lateral and upward directions of a specific electrode of the semiconductor device, a hollow-body structure between the specific electrode and the first resin structure member; a second resin structure member covering an outer lateral side of the first resin structure member, and having the permittivity smaller than or equal to the permittivity of the first resin structure member; and an insulation film covering an outer lateral side of the second resin structure member, and having moisture permeability lower than that of the second resin structure member.

15 Claims, 5 Drawing Sheets

(51) Int. Cl.
*H01L 21/56* (2006.01)
*H01L 23/06* (2006.01)
*H01L 23/522* (2006.01)
*H01L 23/00* (2006.01)

(52) U.S. Cl.
CPC .......... *H01L 23/522* (2013.01); *H01L 23/564* (2013.01)

(56) References Cited

U.S. PATENT DOCUMENTS

| | | | | |
|---|---|---|---|---|
| 8,587,038 | B2* | 11/2013 | Kojima | B81C 1/00246 257/257 |
| 8,829,359 | B2* | 9/2014 | Kojima | B81B 7/0038 174/260 |
| 9,142,681 | B2* | 9/2015 | Watanabe | H01L 23/564 |
| 9,306,052 | B2* | 4/2016 | Ozaki | H01L 21/02126 |
| 9,365,411 | B2* | 6/2016 | Ebina | B81C 1/00293 |
| 9,576,845 | B2* | 2/2017 | Maeda | H01L 21/7682 |
| 9,659,865 | B2* | 5/2017 | Saka | H01L 23/5222 |
| 9,660,065 | B2* | 5/2017 | Ozaki | H01L 29/7786 |
| 9,676,608 | B2* | 6/2017 | Kojima | B81B 7/0038 |
| 9,905,516 | B2* | 2/2018 | Watanabe | H01L 29/78606 |
| 10,043,727 | B2* | 8/2018 | Ozaki | H01L 21/02164 |
| 10,276,671 | B2* | 4/2019 | Ozaki | H01L 23/49513 |
| 10,879,165 | B2* | 12/2020 | Saka | H01L 23/535 |
| 2009/0026589 | A1 | 1/2009 | Kuramoto | |
| 2009/0188709 | A1* | 7/2009 | Kojima | B81B 7/0038 174/260 |
| 2011/0049578 | A1* | 3/2011 | Kojima | B81C 1/00246 257/254 |
| 2013/0032386 | A1* | 2/2013 | Kojima | B81C 1/00476 174/260 |
| 2013/0075735 | A1* | 3/2013 | Watanabe | H01L 29/78606 257/57 |
| 2014/0232835 | A1* | 8/2014 | Kojima | H04N 13/144 348/54 |
| 2014/0353777 | A1* | 12/2014 | Kojima | B81B 7/0038 257/415 |
| 2015/0115411 | A1* | 4/2015 | Ozaki | H01L 29/7786 257/620 |
| 2015/0217992 | A1* | 8/2015 | Ebina | B81C 1/00293 257/415 |
| 2015/0295074 | A1* | 10/2015 | Ozaki | H01L 21/02126 257/194 |
| 2015/0380364 | A1* | 12/2015 | Watanabe | H01L 29/78606 257/43 |
| 2016/0042994 | A1 | 2/2016 | Maeda et al. | |
| 2016/0141240 | A1* | 5/2016 | Saka | H01L 23/4824 257/401 |
| 2016/0247740 | A1* | 8/2016 | Ozaki | H01L 21/02359 |
| 2018/0182854 | A1* | 6/2018 | Ozaki | H01L 29/66462 |
| 2018/0277479 | A1* | 9/2018 | Saka | H01L 23/5222 |
| 2020/0176340 | A1* | 6/2020 | Hosomi | H01L 23/522 |

FOREIGN PATENT DOCUMENTS

| | | |
|---|---|---|
| JP | 2005-314711 A | 11/2005 |
| JP | 2009-032843 A | 2/2009 |
| JP | 2016-039319 A | 3/2016 |

* cited by examiner

SEMICONDUCTOR APPARATUS AND METHOD FOR MANUFACTURING SAME

TECHNICAL FIELD

The present invention relates to a semiconductor apparatus having a hollow-body structure surrounding an electrode of a semiconductor device in the apparatus, and to a manufacturing method therefor.

BACKGROUND ART

In order to achieve large-scale integration of a semiconductor apparatus and miniaturization thereof, a multilayer wiring structure is used in which a resin film and metallic wiring are repeatedly laminated to one another on a semiconductor chip. However, due to the resin films, a parasitic capacitance increases between the gate and source of a field-effect transistor (abbreviated as an "FET," hereinafter in a similar fashion), for example, or that increases between the gate and drain thereof, so that high-frequency characteristics of a semiconductor device degrade.

In addition, also in a semiconductor apparatus in which, in its structure, a semiconductor chip is housed in a package without using the multilayer wiring, there arises a case in which a package structure is desired in that a semiconductor chip is sealed by means of a resin mold for the purposes of miniaturization and lower prices, rather than a structure in which the semiconductor chip is mounted in a hollow vessel made of a dielectric or insulating material such as ceramics or the like; however, in comparison with a case of the hollow seal, a parasitic capacitance (the same as a "stray capacitance," hereinafter in a similar fashion) increases owing to the permittivity of a resin utilized for the resin mold seal, so that the degradation of high-frequency characteristics such as a gain and the like is caused.

For dealing therewith, in order to improve the degradation of those high-frequency characteristics, a semiconductor apparatus is proposed in which, in its structure, the increase of parasitic capacitance is curbed by forming a hollow-body structure on a semiconductor chip (for example, refer to Patent Document 1 and Patent Document 2).

A hollow-body structure on a semiconductor chip is formed by means of, for example, the process steps in that: (a) an FET is formed on a main surface of a semiconductor substrate; subsequently, (b) a first resin layer is formed, on the main surface of the semiconductor substrate, so as to laterally surround a gate electrode of the FET without making contact with the gate electrode; (c) further, without making contact with the gate electrode, a hollow-body structure is formed by bonding a second resin layer covering above the gate electrode onto the top face of the first resin layer, and, from that time onward, heating treatment is performed so that a resin structure is cured or hardened; (d) the hollow-body structure is covered by an insulation film whose moisture permeability is lower than that of a resin forming the hollow-body structure, so that water-vapor or moisture resistance of the hollow-body structure is enhanced; and so forth.

RELATED ART DOCUMENTS

Patent Documents

[Patent Document 1] Japanese Patent Laid-Open No. H05-335343
[Patent Document 2] Japanese Patent Laid-Open No. 2016-39319

SUMMARY OF THE INVENTION

Problems to be Solved by the Invention

In a manner of forming a hollow-body structure, there exists a problem in that, when the pressure at the time of bonding (refer to the process step stated as the item (c) described above) a second resin layer onto a first resin layer is weak and/or nonuniform, an adhesion property becomes weak. At a portion(s) whose adhesion property is weak, the bonding peels off and an ingress path(s) of water moisture into the hollow-body structure is formed, and so, there arises a problem in that the moisture resistance of a semiconductor device results in degradation.

In addition, in a case in which the semiconductor chip is mounted in a package, there arises a problem in that, when a resin mold seal is performed under high-temperature and high-pressure, a portion(s) whose adhesion property is weak is destroyed, so that a mold resin results in entering into a hollow-body structure.

The present invention has been directed at solving those problems described above, and an object of the invention is to obtain, in a semiconductor apparatus having a hollow-body structure on a semiconductor chip, a semiconductor apparatus whose structure prevents degradation of moisture resistance, or breakdown of the hollow-body structure, and to obtain a method of manufacturing the apparatus.

Means for Solving the Problems

A semiconductor apparatus according to the present invention is an apparatus which comprises:

a semiconductor device having electrodes and wiring-interconnects on a main surface of a semiconductor chip;

a first resin structure member, being placed on a side of the main surface of the semiconductor chip, covering laterally and upwardly a specific electrode of the semiconductor device while separating apart from the specific electrode with a space;

a second resin structure member, having permittivity smaller than or equal to permittivity of the first resin structure member, covering an outer lateral side of the first resin structure member while laterally and upwardly making contact with the first resin structure member; and an insulation film, having moisture permeability lower than that of the second resin structure member, covering an outer lateral side of the second resin structure member.

Effects of the Invention

In the semiconductor apparatus according to the present invention, it is so arranged that a hollow-body structure is formed by means of a resin structure member which does not make contact with an electrode, and that an outer lateral side upon the resin structure member above the hollow-body structure is covered by a resin having the permittivity smaller than or equal to the permittivity of a resin structure member constituting hollow-body structure, so that there are not cases in which the bonding of the resin structure member peels off and an ingress path(s) of water moisture into the hollow-body structure is formed, and so it is possible to prevent degradation of moisture resistance of a semiconductor device, or breakdown of the hollow-body structure. In addition, because a parasitic capacitance(s) between the electrode and wiring-interconnects can be reduced, it is achievable to enhance high-frequency characteristics of the semiconductor apparatus.

EMBODIMENTS FOR CARRYING OUT THE INVENTION

Embodiment 1

Figure 1:
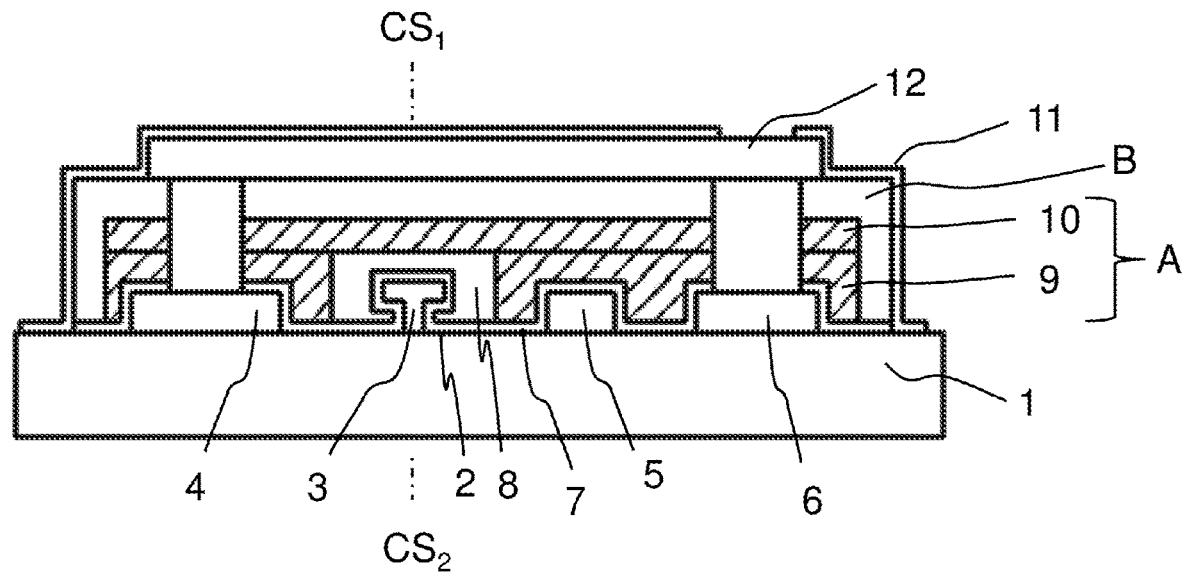
FIG. 1 is a cross-sectional view showing by way of example a semiconductor apparatus according to Embodiment 1 of the present invention.
Figure 2:
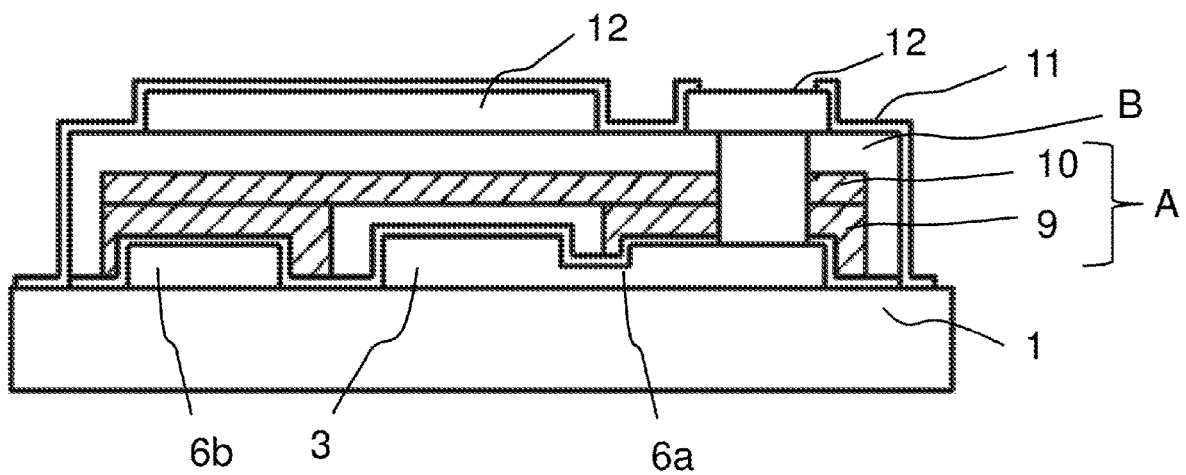
FIG. 2 is a cross-sectional view taken along the symbols $CS_1$-$CS_2$ of FIG. 1.

Hereinafter, the explanation will be made referring to the drawings for a semiconductor apparatus according to Embodiment 1 of the present invention. FIG. 1 is a view showing by way of example the semiconductor apparatus according to Embodiment 1. In addition, FIG. 2 is a cross-sectional view taken along the symbols $CS_1$-$CS_2$ of FIG. 1.

In the semiconductor apparatus according to Embodiment 1, a semiconductor device 2 is formed on a main surface of a semiconductor chip 1. The semiconductor device 2 is a field-effect transistor (FET) having a gate electrode 3 of a figure-Y or figure-T type including overhangs, a source electrode 4, a drain electrode 5, and wiring-interconnects 6. Other than the FET, there also arises a case in which another device such as a diode(s) or the like is formed; and the semiconductor device 2 is covered by means of an insulation film 7 of a silicon nitride film (for example, SiN) or the like.

In addition, as for the gate electrode 3 of the semiconductor device 2, lateral portions (outer space portions of the gate electrode which are made of a set of faces in parallel with side faces of the gate electrode, being the faces having comparable areas to the side faces of the gate electrode) and upward portions (of the gate electrode) are covered by means of a first resin layer 9 and a second resin layer 10 for which polyimide or the like is used; and a resin structure member (the portion shown by the symbol "A" in the figures; hereinafter, referred to as a "first resin structure member"), being formed by the first resin layer 9 and the second resin layer 10, forms a hollow-body structure 8 without making contact with the gate electrode 3. As for a material of the first resin structure member A, the exemplary explanation has been made for a case based on the premise that polyimide of a relative dielectric constant, or relative permittivity, in the degree of 3 is used in the description above; however, a benzocyclobutene resin (hereinafter referred to as a "BCB (BCB: Benzocyclobutene) resin") of relative permittivity in the degree of 2.5 to 2.7 may also be used. It should be noted that, hereinafter, the electrode (the gate electrode in the aforementioned example) in the hollow-body structure described above may also be denoted as a "specific electrode."

An outer lateral side of the first resin structure member A described above is covered by means of a second resin structure member B using a BCB resin. According to the above, as for a material of the second resin structure member B, a resin is utilized which is the same as that used for the first resin structure member A, or a resin is utilized which has the permittivity smaller than that of the resin(s) used for the first resin structure member A.

Wiring-interconnects 12 are formed above the first resin structure member A so as to sandwich (interpose in between) the second resin structure member B; and an outer lateral side of the second resin structure member B is covered by means of an insulation film 11 of a silicon nitride film (for example, SiN) or the like whose water-vapor or moisture permeability (a value of the amount of water moisture which passes through per unit time and unit area; for example, a value indicating that what grams of water moisture passes through per 1 $m^2$ for 24 hours) is smaller than that of the resin used for the second resin structure member B, and by means of the wiring-interconnects 12.

Next, the explanation will be made for wafer manufacturing process steps of the semiconductor apparatus according to Embodiment 1 (refer to FIG. 3 through FIG. 5).

Figure 3:
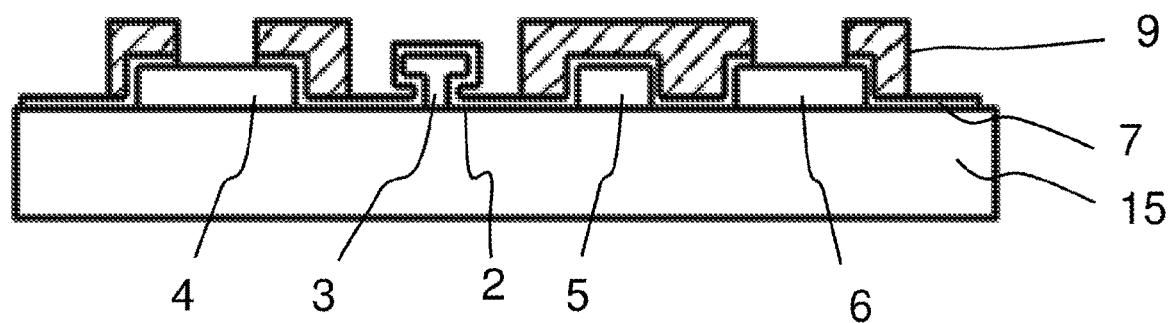
FIG. 3 is a first diagram among a sequence of diagrams for explaining wafer manufacturing process steps of the semiconductor apparatus according to Embodiment 1 of the present invention.

First, as shown in FIG. 3, the semiconductor device 2 is formed on a main surface of a semiconductor substrate 15 which corresponds to the aforementioned semiconductor chip 1, and the semiconductor device 2 is covered by the insulation film 7. And then, on the main surface of the semiconductor substrate 15 and on the semiconductor device 2, a resin film is formed by coating a light-sensitive or photosensitive resin such as photosensitive polyimide or the like; and from that time onward, by performing patterning the resin film by means of exposure and then development, the first resin layer 9 is formed so as to laterally surround the gate electrode 3 without making contact with the gate electrode 3. At this time, by also performing patterning in a similar fashion, it is possible to leave openings at places where wiring-interconnects are to be formed above on a resin structure.

Figure 4:
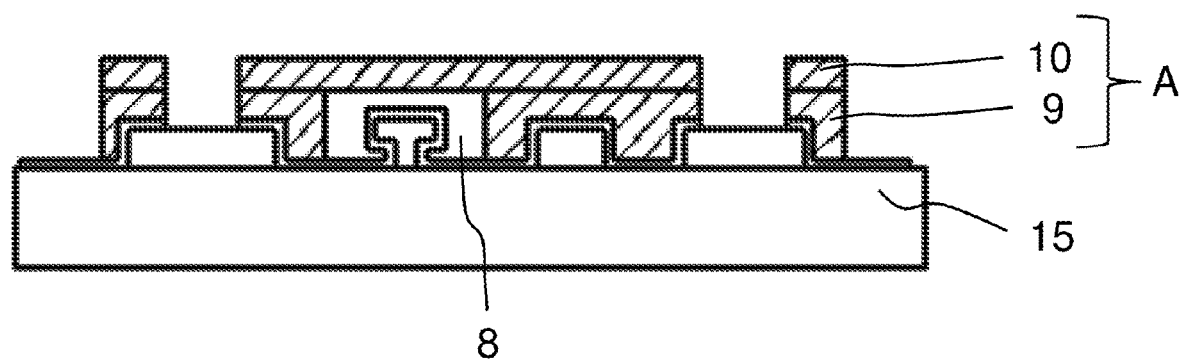
FIG. 4 is a second diagram among a sequence of the diagrams for explaining wafer manufacturing process steps of the semiconductor apparatus according to Embodiment 1 of the present invention.

Next, as shown in FIG. 4, by affixing a sheet of photosensitive polyimide in a semi-cured or semi-hardened state on the top face of the first resin layer 9, the second resin layer 10 is made to seal the hollow-body structure; by performing patterning a resin film by means of exposure and then development, openings are provided at required places such as contact portions or the like of the wiring-interconnects; and from that time onward, heating treatment is performed, so that the first resin layer 9 and the second resin layer 10 are cured or hardened.

Figure 5:
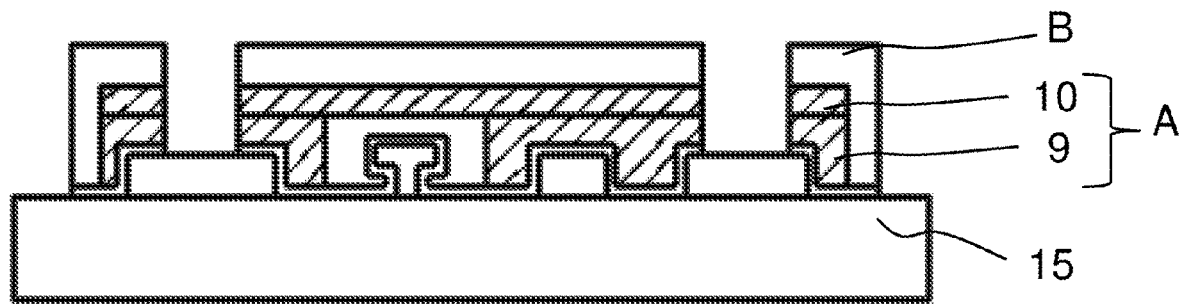
FIG. 5 is a third diagram among a sequence of the diagrams for explaining wafer manufacturing process steps of the semiconductor apparatus according to Embodiment 1 of the present invention.

Subsequently, as shown in FIG. 5, a resin film is formed by coating a BCB resin on the main surface of the semiconductor substrate 15 or on the first resin structure member A, and the resin film is hardened; and from that time onward, opening portions or unwanted portions are removed by dry etching, so that the second resin structure member B is formed. From then on, the wiring-interconnects 12 are formed, and furthermore side faces of the second resin structure member B and/or exposed portions thereabove are covered on by means of the insulation film 11 (not shown in the figure) of a silicon nitride film (for example, SiN) or the like, whereby the semiconductor apparatus of FIG. 1 can be manufactured.

Next, the explanation will be made below for the operations of the semiconductor apparatus according to Embodiment 1. In the semiconductor apparatus according to Embodiment 1, even when there exists a portion(s) whose adhesion property is weak in the first resin structure member A described above, the second resin structure member B reinforces the weak portion(s), whereby it is prevented that the bonding of the first resin structure member A peels off, and that an ingress path(s) of water moisture into the hollow-body structure is formed; and thus, it is possible to prevent degradation of water-vapor or moisture resistance of the semiconductor device 2.

Moreover, according to the manner in that the permittivity of the resin in the second resin structure member B of the semiconductor apparatus according to Embodiment 1 is made smaller than the permittivity of the resin in the second resin layer 10, a parasitic capacitance(s) between the gate electrode 3 and the wiring-interconnects 12, or that between the drain electrode 5 and the wiring-interconnects 12 can be reduced, in comparison with a manner in which the first resin structure member A is only formed. By adopting such a structure, it is achievable to enhance high-frequency characteristics of the semiconductor apparatus.

Embodiment 2

Hereinafter, the explanation will be made referring to the drawing for a semiconductor apparatus according to Embodiment 2 of the present invention.

Figure 6:
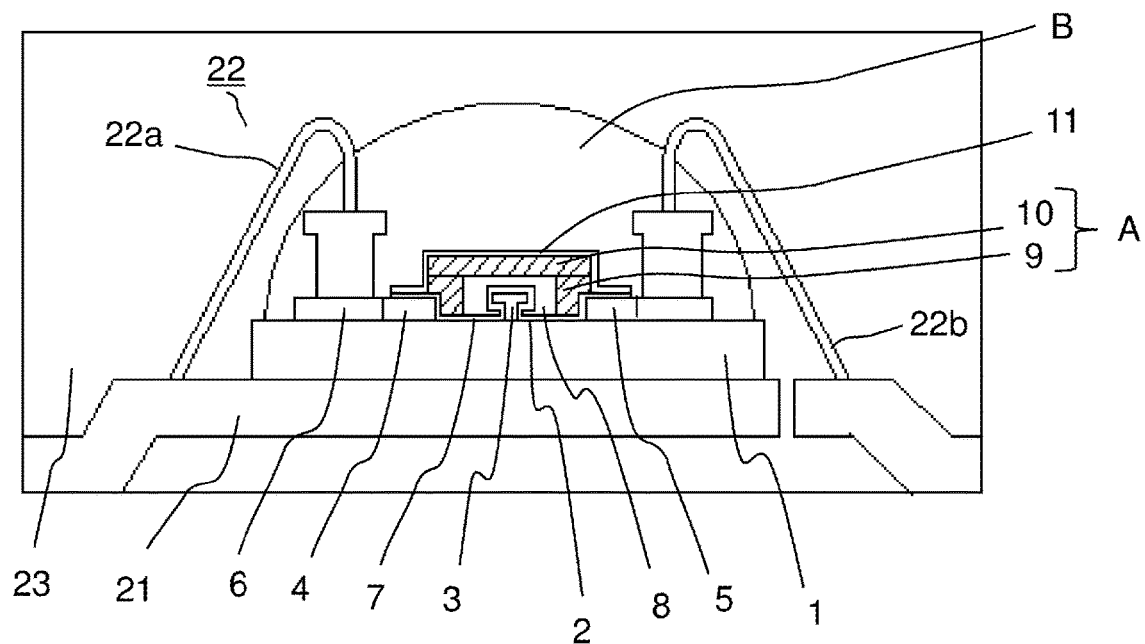
FIG. 6 is a cross-sectional view showing by way of example a semiconductor apparatus according to Embodiment 2 of the present invention.

FIG. 6 is a cross-sectional view showing by way of example the semiconductor apparatus according to Embodiment 2. On a main surface of the semiconductor chip 1, the semiconductor device 2 is formed.

The semiconductor device 2 is a field-effect transistor (FET) having the gate electrode 3 of a figure-Y or figure-T type including overhangs, the source electrode 4, the drain electrode 5, and the wiring-interconnects 6. Other than the FET, there also arises a case in which another device such as a diode(s) or the like is formed. Here, the semiconductor device 2 is covered by means of the insulation film 7 of a silicon nitride film (for example, SiN) or the like.

The gate electrode 3 of the semiconductor device 2 is covered laterally and upwardly by means of the first resin layer 9 and the second resin layer 10 for which polyimide or the like is used; and the first resin structure member A formed by the first resin layer 9 and the second resin layer 10 does not make contact with the gate electrode 3, so that the hollow-body structure 8 is formed. As for a material of the first resin structure member A, the polyimide is used in the explanation described above; however, a BCB resin or the like may be used. In addition, a directly outer lateral side of the first resin structure member A is covered by means of the insulation film 11 of a silicon nitride film (for example, SiN) or the like whose moisture permeability is lower than that of a resin(s) used for the first resin structure member A.

The semiconductor chip 1 is mounted on a frame 21 of its package, and the semiconductor chip 1 and the frame 21 are electrically connected to each other by means of wires 22 (in the figure, a wire 22a and a wire 22b).

In addition, upon the semiconductor chip 1, the second resin structure member B whose permittivity is the same as or smaller than that of a resin(s) used for the first resin structure member A is coated on the outer lateral side of the aforementioned insulation film 11; and from that time onward, the semiconductor chip is sealed by an epoxy thermosetting resin member 23 of relative permittivity in the degree of 4, and enclosed in a package thereby.

Moreover, in the semiconductor apparatus according to Embodiment 2, the second resin structure member B takes on a structure to protect the first resin structure member A, as shown in FIG. 6. And then, on the basis of this structure, it becomes possible to prevent that, when a mold seal is performed under high-temperature and high-pressure ambients by means of the epoxy thermosetting resin member described above, a portion(s) whose adhesion property of the first resin structure member A is weak is destroyed, and then that a mold resin results in entering into the hollow-body structure of the first resin structure member A.

In the semiconductor apparatus according to Embodiment 2, according to the manner in that the permittivity of the second resin structure member B is particularly made smaller than that of the epoxy thermosetting resin member 23, a reduction effect of a parasitic capacitance(s) between the gate electrode 3 and the wiring-interconnects 6 is made larger, in comparison with a manner in which the first resin structure member A is only formed. According to the arrangement described above, in the semiconductor apparatus according to Embodiment 2, it is achievable to enhance high-frequency characteristics thereof.

It should be noted that, in the manner described above, the exemplary explanation has been made for the second resin structure member having the permittivity smaller than or equal to that of the first resin structure member A as a resin structure member covering an outer lateral side of the insulation film 11; however, when it is performed that, in place of the second resin structure member, a third resin structure member C (not shown in the figure) whose permittivity is smaller than that of the second resin structure member, representative of a fluorine-contained resin of relative permittivity in the degree of 2, for example, is coated, it is needless to say that the effect is further enhanced thereby.

Embodiment 3

Next, the explanation will be made referring to the drawing for a semiconductor apparatus according to Embodiment 3 of the present invention.

Figure 7:
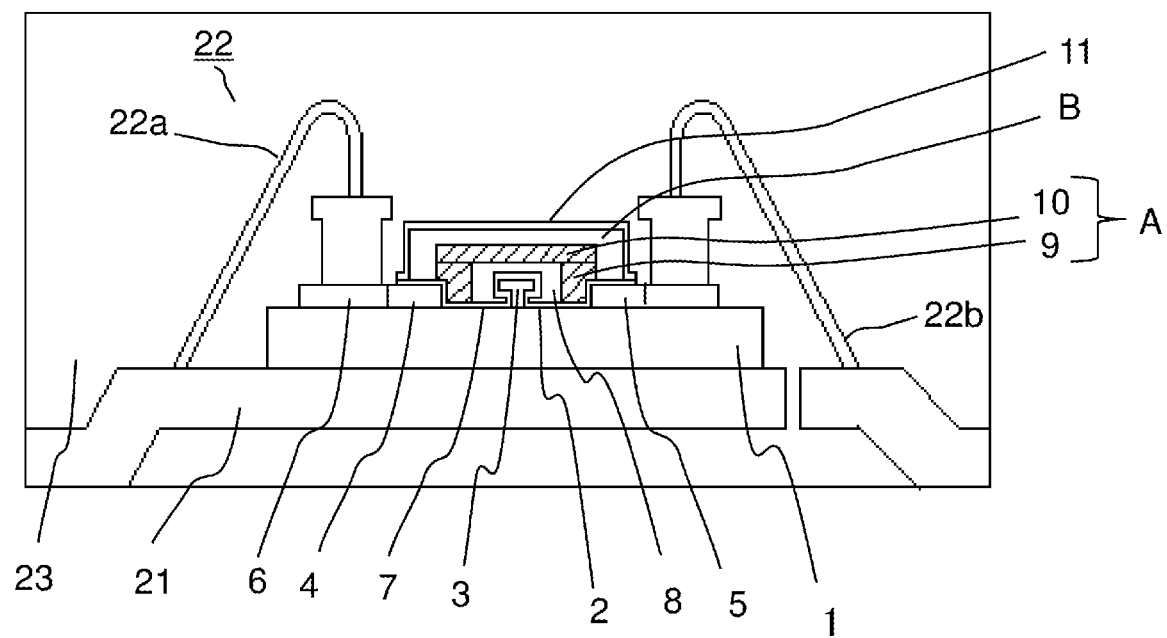
FIG. 7 is a cross-sectional view showing by way of example a semiconductor apparatus according to Embodiment 3 of the present invention.

In FIG. 7, the semiconductor device 2 is formed on a main surface of the semiconductor chip 1. The semiconductor device 2 is a field-effect transistor (FET) having the gate electrode 3 of a figure-Y or figure-T type including overhangs, the source electrode 4, the drain electrode 5, and the wiring-interconnects 6. Other than the FET, there also arises a case in which another device such as a diode(s) or the like is formed.

In addition, the semiconductor device 2 described above is covered by means of the insulation film 7 of a silicon nitride film (for example, SiN) or the like. The gate electrode 3 of the semiconductor device 2 is covered laterally and upwardly by means of the first resin layer 9 and the second resin layer 10 for which polyimide or the like is used; and the first resin structure member A formed by the first resin layer 9 and the second resin layer 10 does not make contact with the gate electrode 3, so that the hollow-body structure 8 is formed.

In the above statement, the exemplary explanation has been made for a case based on the premise that polyimide of relative permittivity in the degree of 3 is used for a material of the first resin structure member A in the semiconductor apparatus according to Embodiment 3; however, a BCB resin of relative permittivity in the degree of 2.5 to 2.7 or the like may also be used therefor.

In this embodiment, an outer lateral side of the first resin structure member A is covered by means of the second resin structure member B using a BCB resin. As for a material of the second resin structure member B, a resin of relative permittivity in the degree of 2.5 to 2.7 may also be used other than the BCB resin; i.e., a resin is utilized which is the same as a resin used for the first resin structure member A, or which has the permittivity smaller than that of a resin(s) used for the first resin structure member A.

In addition, on an outer lateral side of the second resin structure member B, the insulation film 11 of a silicon nitride film (for example, SiN) or the like covers, where its moisture permeability is lower than that of a resin used for the second resin structure member B.

Moreover, in the semiconductor apparatus according to Embodiment 3, the semiconductor chip 1 is mounted on the frame 21 of its package, and the semiconductor chip 1 and the frame 21 are electrically connected to each other by means of the wires 22 (in the figure, the wire 22a and the wire 22b); and from that time onward, the semiconductor chip is sealed by the epoxy thermosetting resin member 23 which is the same as that explained in Embodiment 2, and enclosed in a package thereby.

Next, the explanation will be made below for the operations of the semiconductor apparatus according to Embodiment 3. When a mold seal is performed under high-temperature and high-pressure ambients by means of the epoxy thermosetting resin member 23 described above, the second resin structure member B protects the first resin structure member A. According to this arrangement, it becomes achievable to prevent that a portion(s) whose adhesion property of the first resin structure member A is weak is destroyed, and then that a mold resin results in entering into the hollow-body structure.

In addition, according to the manner in that the permittivity of the second resin structure member B is made smaller than that of the epoxy thermosetting resin member 23, a parasitic capacitance(s) between the gate electrode 3 and the wiring-interconnects 6, or that between the gate electrode 3 and the wires 22 can be reduced, in comparison with a manner in which the first resin structure member A is only formed. According to this arrangement, it becomes possible to enhance high-frequency characteristics of the semiconductor apparatus according to Embodiment 3.

Embodiment 4

Next, the explanation will be made below referring to FIG. 8 for a semiconductor apparatus according to Embodiment 4 of the present invention.

The semiconductor apparatus according to Embodiment 4 approximately takes on a structure in which Embodiment 2 and Embodiment 3 described above are combined with each other.

Figure 8:
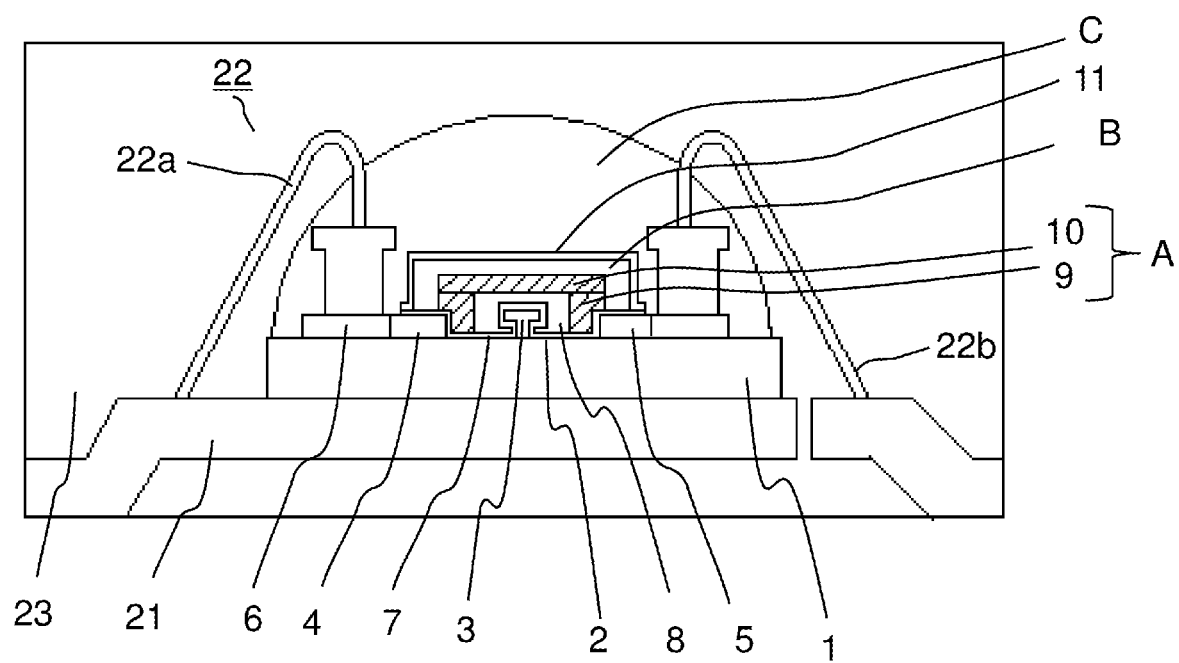
FIG. 8 is a cross-sectional view showing by way of example a semiconductor apparatus according to Embodiment 4 of the present invention.

In this embodiment, differing from the case in Embodiment 2 (specifically, as shown in FIG. 8), the second resin structure member B having the permittivity smaller than that of a resin(s) used for the first resin structure member A is provided upon an outer lateral side of the first resin structure member A. And then, the insulation film 11 of a silicon nitride film (for example, SiN) or the like whose moisture permeability is lower than that of the second resin structure member B covers an outer lateral side of the second resin structure member B.

Furthermore, upon an outer lateral side of the insulation film 11, a third resin structure member C whose permittivity is smaller than that of the first resin structure member A, representative of a fluorine-contained resin of relative permittivity in the degree of 2, for example, is coated.

Note that, the operations of the semiconductor apparatus according to Embodiment 4 and the effects thereof are equivalent or similar to those in Embodiment 2 or those in Embodiment 3 described above; thus, their explanation is omitted here.

It should be noted that, in the present invention, each of the embodiments can be freely combined, and/or each of the embodiments can be appropriately modified or eliminated without departing from the scope of the invention.

EXPLANATION OF NUMERALS AND SYMBOLS

Numeral "1" designates a semiconductor chip; "2," semiconductor device; "3," gate electrode; "4," source electrode; "5," drain electrode; "6," "12," wiring-interconnect; "7," "11," insulation film; "8," hollow-body structure; "9," first resin layer; "10," second resin layer; "15," semiconductor substrate; "21," frame; "22," "22a," "22b," wire; "23," epoxy thermosetting resin member; "A," first resin structure member; "B," second resin structure member; and "C," third resin structure member.

What is claimed is:

1. A semiconductor apparatus, comprising:
   a semiconductor device having a plurality of electrodes and first wiring-interconnects on a main surface of a semiconductor chip, the plurality of electrodes including a first electrode;
   a first resin structure member, being placed on a side of the main surface of the semiconductor chip, covering laterally and upwardly the first electrode of the semiconductor device while separating apart from the first electrode with a space;
   a second resin structure member, having a permittivity smaller than or equal to a permittivity of the first resin structure member, covering an outer lateral side of the first resin structure member while laterally and upwardly making contact with the first resin structure member; and
   an insulation film, having a moisture permeability lower than that of the second resin structure member, covering an outer lateral side of the second resin structure member.

2. The semiconductor apparatus as set forth in claim 1, wherein
   second wiring-interconnects, being multilayered, are placed above and on the second resin structure member.

3. The semiconductor apparatus as set forth in claim 2, wherein
   the semiconductor device, the first resin structure member, the second resin structure member and the insulation film are all sealed by means of an epoxy thermosetting resin member and are enclosed in a package thereby.

4. The semiconductor apparatus as set forth in claim 2, wherein
   the second resin structure member and an outer lateral side of the insulation film are covered with a third resin structure member made of a resin having a permittivity smaller than or equal to the permittivity of the first resin structure member and that of the second resin structure member.

5. The semiconductor apparatus as set forth in claim 2, wherein
the first electrode includes overhangs to take on a cross-sectional shape of a figure-Y or figure-T.

6. The semiconductor apparatus as set forth in claim 2, wherein
the first electrode is a gate electrode, and
the gate electrode includes overhangs to take on a cross-sectional shape of a figure-Y or figure-T.

7. The semiconductor apparatus as set forth in claim 1, wherein
the semiconductor device, the first resin structure member, the second resin structure member and the insulation film are all sealed by means of an epoxy thermosetting resin member and are enclosed in a package thereby.

8. The semiconductor apparatus as set forth in claim 1, wherein
the second resin structure member and an outer lateral side of the insulation film are covered with a third resin structure member made of a resin having a permittivity smaller than or equal to a permittivity of the first resin structure member and that of the second resin structure member.

9. A method of manufacturing a semiconductor apparatus as set forth in claim 8, the method comprising the steps of:
forming a semiconductor device having a plurality of electrodes and first wiring-interconnects on a main surface of a semiconductor substrate, the plurality of electrodes including a first electrode;
forming a first resin layer, on a side of the main surface of the semiconductor substrate, so as to laterally surround the first electrode of the semiconductor device without making contact with the first electrode;
bonding a second resin layer placed above the first electrode onto a top face of the first resin layer, and, after hardening the resin layers together, placing them while separating apart from the first electrode with a space;
forming upwardly and laterally a third resin layer on the first resin layer and the second resin layer by means of a resin having a permittivity smaller than permittivities of a resin of the first resin layer and that of the second resin layer; and
covering a top face of the third resin layer and a side face thereof with an insulation film whose moisture permeability is lower than that of the third resin layer.

10. The semiconductor apparatus as set forth in claim 1, wherein
the first electrode includes overhangs to take on a cross-sectional shape of a figure-Y or figure-T.

11. A method of manufacturing a semiconductor apparatus as set forth in claim 1, the method comprising the steps of:
forming a semiconductor device having a plurality of electrodes and first wiring-interconnects on a main surface of a semiconductor substrate, the plurality of electrodes including a first electrode;
forming a first resin layer, on a side of the main surface of the semiconductor substrate, so as to laterally surround the first electrode of the semiconductor device without making contact with the first electrode;
bonding a second resin layer placed above the first electrode onto a top face of the first resin layer, and, after hardening the resin layers together, placing them while separating apart from the first electrode with a space;
forming upwardly and laterally a third resin layer on the first resin layer and the second resin layer by means of a resin having a permittivity smaller than permittivities of a resin of the first resin layer and that of the second resin layer; and
covering a top face of the third resin layer and a side face thereof with an insulation film whose moisture permeability is lower than that of the third resin layer.

12. The semiconductor apparatus as set forth in claim 1, wherein
the permittivity of the second resin structure member is smaller than the permittivity of the first resin structure member.

13. The semiconductor apparatus as set forth in claim 1, wherein
the first electrode is a gate electrode.

14. The semiconductor apparatus as set forth in claim 13, wherein
the gate electrode includes overhangs to take on a cross-sectional shape of a figure-Y or figure-T.

15. The semiconductor apparatus as set forth in claim 1, wherein
the first resin structure member forms a hollow-body structure around only the first electrode.

* * * * *